United States Patent
Kiyama et al.

(10) Patent No.: US 8,041,198 B2
(45) Date of Patent: Oct. 18, 2011

(54) HEAT TREATMENT APPARATUS AND METHOD FOR HEATING SUBSTRATE BY PHOTO-IRRADIATION

(75) Inventors: Hiroki Kiyama, Kyoto (JP); Kenichi Yokouchi, Kyoto (JP)

(73) Assignee: Dainippon Screen Mfg.Co., Ltd. (JP)

( * ) Notice: Subject to any disclaimer, the term of this patent is extended or adjusted under 35 U.S.C. 154(b) by 377 days.

(21) Appl. No.: 12/424,192

(22) Filed: Apr. 15, 2009

(65) Prior Publication Data

US 2009/0285568 A1    Nov. 19, 2009

(30) Foreign Application Priority Data

May 13, 2008    (JP) ................................ 2008-125707

(51) Int. Cl.
  *F26B 3/30* (2006.01)
  *C23C 16/00* (2006.01)
  *A21B 1/00* (2006.01)
(52) U.S. Cl. ................... 392/418; 118/725; 219/405
(58) Field of Classification Search .......... 392/407–440; 118/725, 720–724; 219/385–471
See application file for complete search history.

(56) References Cited

U.S. PATENT DOCUMENTS

| 6,936,797 | B2 | 8/2005 | Hosokawa | 219/405 |
| 6,998,580 | B2 | 2/2006 | Kusuda et al. | 219/411 |
| 7,183,229 | B2 * | 2/2007 | Yamanaka | 438/795 |
| 7,381,928 | B2 | 6/2008 | Kusuda et al. | |
| 7,616,872 | B2 * | 11/2009 | Camm et al. | 392/416 |
| 2009/0103906 | A1 * | 4/2009 | Kusuda | 392/418 |
| 2009/0166351 | A1 * | 7/2009 | Yokomori | 219/492 |
| 2009/0263112 | A1 * | 10/2009 | Kiyama et al. | 392/418 |
| 2009/0285568 | A1 * | 11/2009 | Kiyama et al. | 392/418 |

* cited by examiner

*Primary Examiner* — Daniel L Robinson
(74) *Attorney, Agent, or Firm* — Ostrolenk Faber LLP

(57) ABSTRACT

In photo-irradiation heating with a total photo-irradiation time of one second or less, after initial photo-irradiation of a semiconductor wafer is performed while increasing an emission output to a target value, succeeding photo-irradiation of the semiconductor wafer is performed while maintaining the emission output within a range of plus or minus 20% from the target value. The photo-irradiation time for the initial photo-irradiation ranges from 0.1 to 10 milliseconds, and the photo-irradiation time for the succeeding photo-irradiation ranges from 5 milliseconds to less than one second. This allows the temperature of the semiconductor wafer even at a somewhat greater depth below the surface to be raised to some extent while allowing the surface temperature to be maintained at a generally constant processing temperature, thus achieving both the activation of implanted ions and the repair of introduced defects without any thermal damage to the semiconductor wafer.

14 Claims, 11 Drawing Sheets

F I G . 1
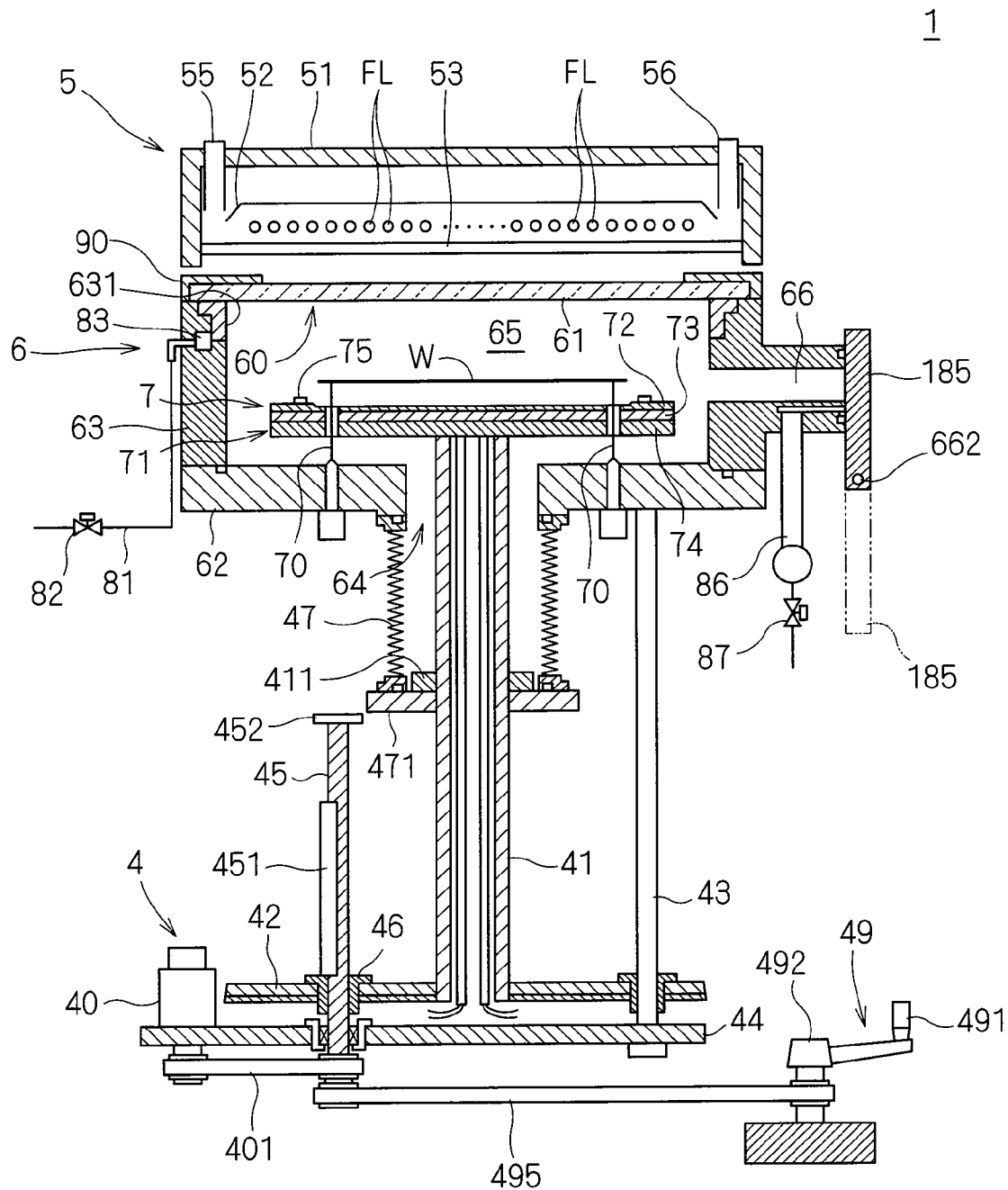

F I G . 2
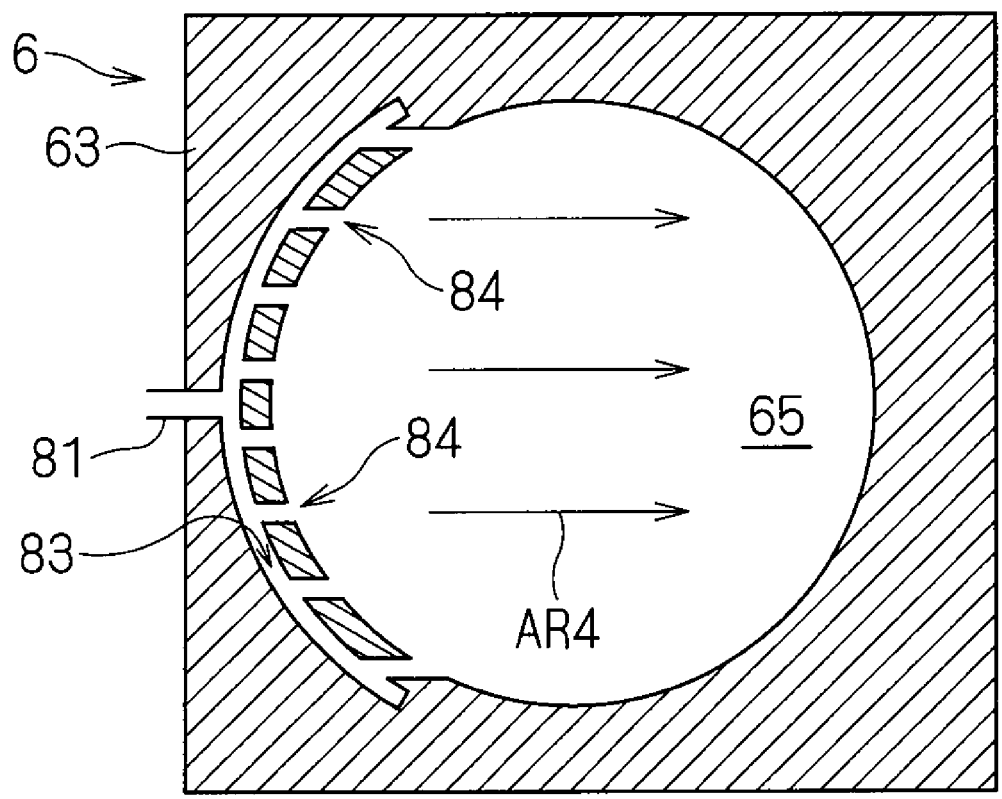

F I G . 7
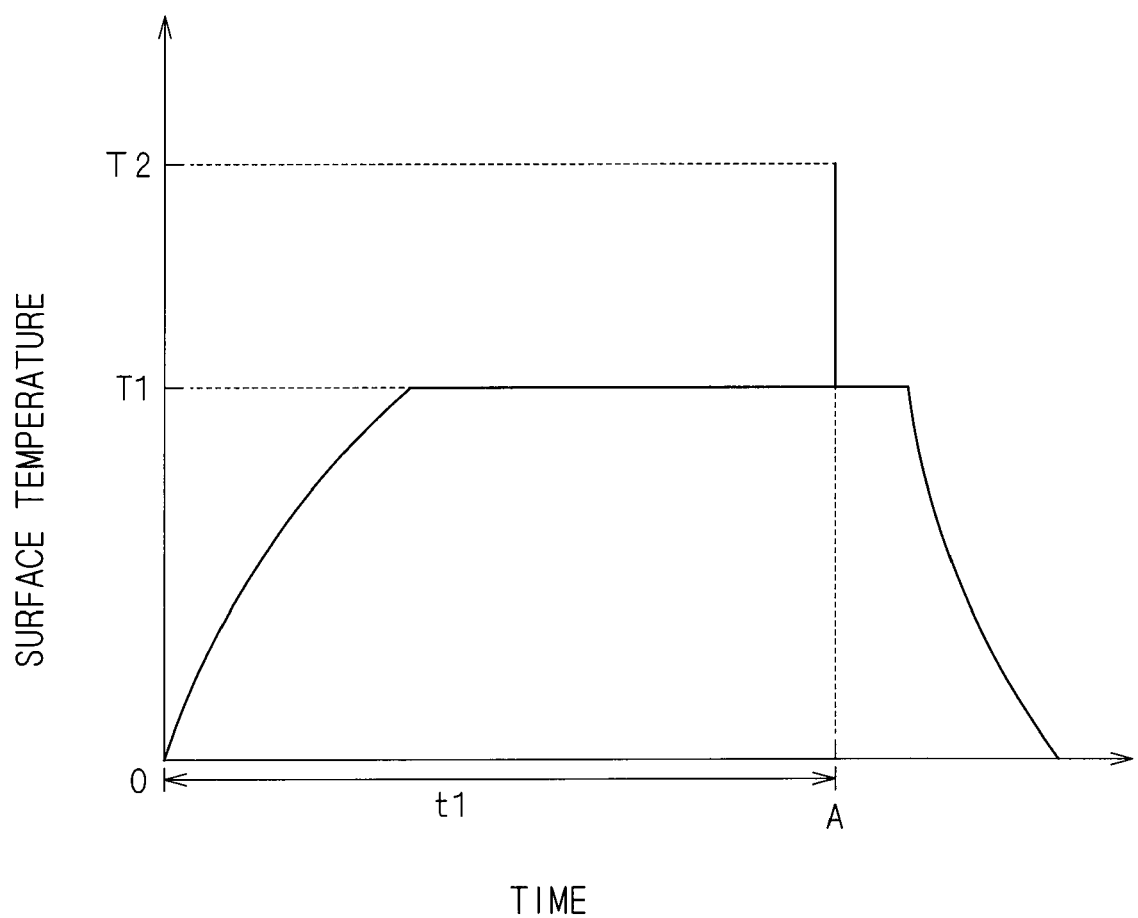

F I G. 9
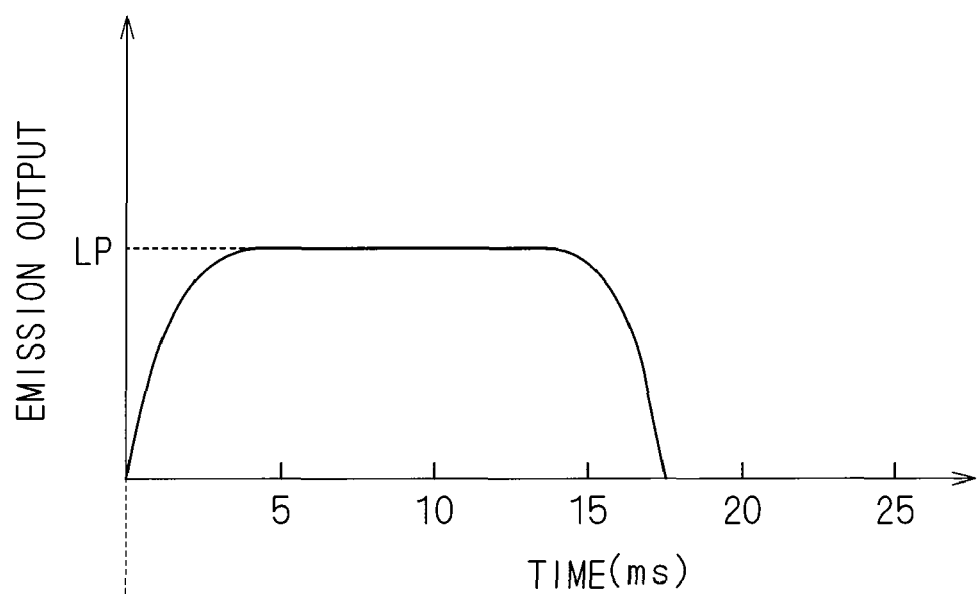
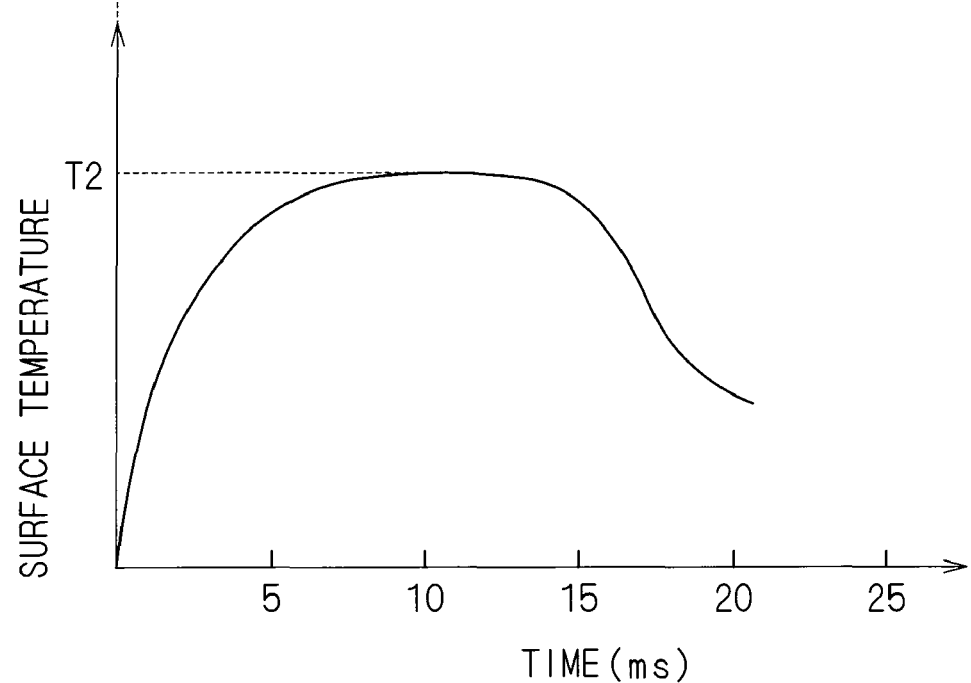

HEAT TREATMENT APPARATUS AND METHOD FOR HEATING SUBSTRATE BY PHOTO-IRRADIATION

BACKGROUND OF THE INVENTION

1. Field of the Invention

The present invention relates to a heat treatment apparatus and method for heating a semiconductor wafer, a glass substrate for a liquid crystal display, and the like (hereinafter referred to simply as a "substrate") by photo-irradiation of the substrate.

2. Description of the Background Art

Conventionally, a lamp annealer employing halogen lamps has been commonly used in the step of activating ions in a semiconductor wafer after ion implantation. Such a lamp annealer carries out the activation of ions in a semiconductor wafer by heating (or annealing) the semiconductor wafer to a temperature of the order of, for example, 1000 to 1100° C. In such a heat treatment apparatus, the energy of the light emitted from halogen lamps is used to raise the substrate temperature at a rate of about several hundred degrees per second.

In recent years, with the increasing integration of semiconductor devices, it has been desired that junctions be made shallower with decreasing gate length. It has, however, transpired that even if the above lamp annealer, which raises the temperature of a semiconductor wafer at a rate of about several hundred degrees per second, is used to carry out the activation of ions in a semiconductor wafer, a phenomenon still occurs where boron, phosphorous, or other ions implanted in the semiconductor wafer are deeply heat diffused. The occurrence of such a phenomenon gives rise to the apprehension that the junction may become deeper than the desired level, hindering good device formation.

With regard to this, U.S. Pat. Nos. 6,998,580 and 6,936,797 disclose techniques for raising only the surface temperature of an ion-impregnated semiconductor wafer within an extremely short period of time (several milliseconds or less) by irradiating the surface of the semiconductor wafer with flashes of light from xenon flash lamps (The term "flash lamp" as used hereinafter refers to a "xenon flash lamp.") The xenon flash lamps have a spectral distribution of radiation ranging from ultraviolet to near-infrared regions. The wavelength of the light emitted from xenon flash lamps is shorter than that of the light emitted from conventional halogen lamps, and it almost coincides with the fundamental absorption band of a silicon semiconductor wafer. Thus, when a semiconductor wafer is irradiated with the flash light emitted from xenon flash lamps, the temperature of the semiconductor wafer can be raised rapidly with only a small amount of light transmitted through the semiconductor wafer. It has also transpired that the flash light emitted within an extremely short period of time such as several milliseconds or less allows a selective temperature rise only near the surface of a semiconductor wafer. Such an extremely quick temperature rise with xenon flash lamps will allow only the ion activation to be implemented without deep diffusion of the ions.

Now, as a result of high-energy ion implantation prior to such flash heating, a number of defects are introduced into a silicon crystal of a semiconductor wafer. Such defects tend to be introduced to a somewhat greater depth below the ion-impregnated layer. For the implementation of flash heating, it is hence desirable that not only the ion activation but also the repair of such introduced defects be carried out together.

However, in extremely quick irradiation where the time of light emission from the flash lamps is only about one millisecond, the speed of temperature rise at the surface of the semiconductor wafer is higher than the speed of heat transmission to the inside of the semiconductor wafer due to the thermal conductivity of silicon. This enables a temperature rise in the ion-implanted layer, but not to a depth at which defects are introduced. Nevertheless, if extremely high-energy light is emitted from the flash lamps, it would be possible, even with extremely quick irradiation for about one millisecond, to raise the temperature at a depth where defects are introduced and thereby repair those defects. However, there arises a problem in that the surface temperature would rise considerably, causing damage to the semiconductor wafer.

There has also been a suggestion to extend the time of photo-irradiation by the flash lamps to about several milliseconds by controlling the coil constant of a power supply circuit supplying power to the flash lamps. Such extension of the irradiation time to about several milliseconds is considered effective in repairing defects introduced during ion implantation, because it allows a temperature rise not only at the surface of the semiconductor wafer but also to a somewhat greater depth inside the semiconductor wafer. However, there is a possibility that extending the time of photo-irradiation by the flash lamps may cause the generation of new crystal defects because of a continuous temperature rise at the surface of a semiconductor wafer.

SUMMARY OF THE INVENTION

The present invention is directed to a heat treatment method for heating a substrate by photo-irradiation of the substrate.

According to an aspect of the invention, the heat treatment method includes the following steps: a first photo-irradiation step of performing photo-irradiation of a substrate while increasing an emission output to a target value; and a second photo-irradiation step of performing photo-irradiation of the substrate while maintaining the emission output within a range of plus or minus 20% from the target value; wherein a total of a photo-irradiation time in the first photo-irradiation step and a photo-irradiation time in the second photo-irradiation step is one second or less, and the photo-irradiation time in the second photo-irradiation step ranges from 5 milliseconds to less than one second.

The temperature of the substrate even at a depth where defects are introduced can be raised to some extent without the substrate surface being heated excessively. This allows the implementation of both the activation of implanted ions and the repair of introduced defects without any damage to the substrate.

The present invention is also directed to a heat treatment apparatus for heating a substrate by photo-irradiation of the substrate.

According to another aspect of the invention, the heat treatment apparatus includes the following: a holder for holding a substrate; a photo-irradiation part for irradiating a substrate held by the holder with light; a light-emission controller for controlling an emission output of the photo-irradiation part. The light-emission controller is configured to control an emission output of the photo-irradiation part in such a manner that, after an initial photo-irradiation of a substrate is performed while increasing the emission output to a target value, a succeeding photo-irradiation of the substrate is performed while maintaining the emission output within a range of plus or minus 20% from the target value. The light-emission controller is also configured to control the photo-irradiation part in such a manner that a total of a photo-irradiation time for the initial photo-irradiation and a photo-irradiation time for the succeeding photo-irradiation is one second or less and that the photo-irradiation time for the succeeding photo-irradiation ranges from 5 milliseconds to less than one second.

The temperature of the substrate even at a depth where defects are introduced can be raised to some extent without the substrate surface being heated excessively. This allows the implementation of both the activation of implanted ions and the repair of introduced defects without any damage to the substrate.

According to still another aspect of the invention, the heat treatment apparatus includes the following: a holder for holding a substrate; a flash lamp for irradiating a substrate held by the holder with light; and a switching element connected in series to the flash lamp, a capacitor, and a coil; and an energization controller for controlling the energization of the flash lamp by turning the switching element on or off. The energization controller is configured first to turn the switching element on so as to increase an emission output of the flash lamp to a target value, and then to repeat the turning on and off of the switching element so as to achieve a stable state where the emission output of the flash lamp is maintained within a range of plus or minus 20% from the target value.

The light emission from the flash lamp allows the temperature of the substrate even at a depth where defects are introduced to be raised to some extent without the substrate surface being heated excessively. This allows the implementation of both the activation of implanted ions and the repair of introduced defects without any damage to the substrate.

Preferably, the energization controller is configured to repeat the turning on and off of the switching element in such a manner that, during the stable state, a combination of an ON-state period of a given time and a subsequent plurality of ON-state periods, each of which is shorter than the given time, is repeated a plurality of times.

This allows the emission output from the flash lamp to be maintained with stability within the range of plus or minus 20% from the target value.

Still more preferably, the energization controller is configured to repeat the turning on and off of the switching element in such a manner that, during the stable state, the last ON-state period is longer than the first ON-state period.

This allows the emission output from the flash lamp to be maintained with stability within the range of plus or minus 20% from the target value.

Still more preferably, the switching element is an insulated gate bipolar transistor.

This is suitable for light emission from a flash lamp that requires a large amount of power.

It is therefore an object of the present invention to implement both the activation of implanted ions and the repair of introduced defects without any damage to the substrate.

These and other objects, features, aspects and advantages of the invention will become more apparent from the following detailed description of the invention when taken in conjunction with the accompanying drawings.

BRIEF DESCRIPTION OF THE DRAWINGS

FIG. 1 is a side sectional view of a configuration of a heat treatment apparatus according to the present invention.

FIG. 2 is a sectional view of a gas passage in the heat treatment apparatus in FIG. 1.

FIG. 7 shows the change in the surface temperature of a semiconductor wafer from the start of preheating.

FIG. 9 shows an example of the correlation between the emission output of a flash lamp and the surface temperature of a semiconductor wafer.

DESCRIPTION OF THE PREFERRED EMBODIMENTS

Figure 3:
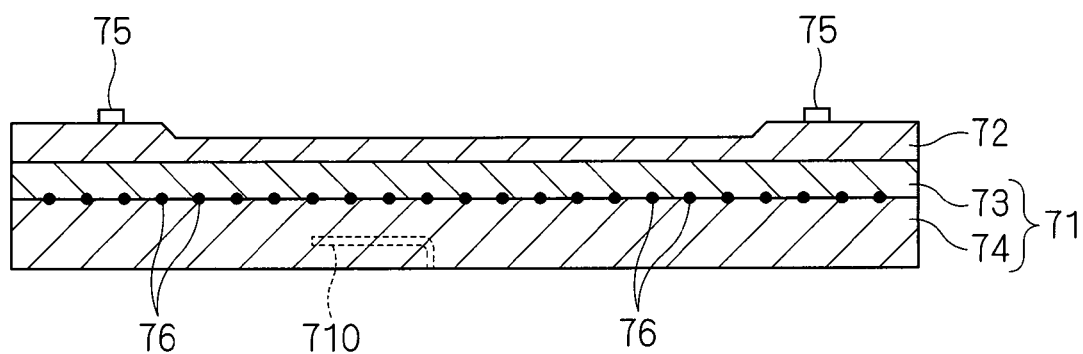
FIG. 3 is a sectional view of the structure of a holder.

A preferred embodiment of the invention is now described in detail with reference to the drawings.

First, a general configuration of a heat treatment apparatus according to the invention is outlined. FIG. 1 is a side sectional view of a configuration of a heat treatment apparatus 1 according to the invention. The heat treatment apparatus 1 is a lamp annealer for applying light to a generally disc-shaped semiconductor wafer W serving as a substrate to thereby heat the semiconductor wafer W.

The heat treatment apparatus 1 includes a generally cylindrical chamber 6 for receiving a semiconductor wafer W therein; and a lamp house 5 including a plurality of built-in flash lamps FL. The heat treatment apparatus 1 further includes a controller 3 for controlling each operating mechanism provided in the chamber 6 and in the lamp house 5 for the implementation of the heat treatment of a semiconductor wafer W.

The chamber 6 is located below the lamp house 5 and includes a chamber side portion 63 having a generally cylindrical inner wall and a chamber bottom portion 62 covering the bottom of the chamber side portion 63. A space surrounded by the chamber side portion 63 and the chamber bottom portion 62 is defined as a heat treatment space 65. Above the heat treatment space 65 is a top opening 60 equipped with and blocked by a chamber window 61.

The chamber window 61 forming the ceiling of the chamber 6 is a disk-shaped member made of quartz and serves as a quartz window that transmits light emitted from the lamp house 5 into the heat treatment space 65. The chamber bottom portion 62 and the chamber side portion 63, which form the main body of the chamber 6, are made of, for example, a metal material such as stainless steel with high strength and high heat resistance; and an upper ring 631 on the inner side face of the chamber side portion 63 is made of an aluminum (Al) alloy or the like with greater durability than stainless steel against degradation due to light emission.

In order to maintain the hermetic state of the heat treatment space 65, the chamber window 61 and the chamber side portion 63 are sealed with an O-ring. To be more specific, an O-ring is inserted between an underside peripheral portion of the chamber window 61 and the chamber side portion 63, and a clamp ring 90 is provided to abut against an upper-side peripheral portion of the chamber window 61 and to be screwed to the chamber side portion 63, thereby forcing the chamber window 61 onto the O-ring.

The chamber bottom portion 62 has a plurality of (three, in this preferred embodiment) support pins 70 extending upright therefrom through a holder 7 in order to support a semiconductor wafer W from the underside (the surface opposite the surface receiving light from the lamp house 5) of the semiconductor wafer W. The support pins 70 are made of, for example, quartz and can be replaced easily because they are secured from outside the chamber 6.

The chamber side portion 63 has a transport opening 66 for the transport of a semiconductor wafer W. The transport opening 66 is openable and closable by a gate valve 185 that pivots about an axis 662. On the opposite side of the chamber side portion 63 from the transport opening 66, an inlet passage 81 is formed, which introduces a processing gas (e.g., an inert gas such as a nitrogen ($N_2$) gas, a helium (He) gas, or an argon (Ar) gas; or an oxygen ($O_2$) gas and the like) into the heat treatment space 65. The inlet passage 81 has one end connected through a valve 82 to a gas supply mechanism not shown and the other end connected to a gas inlet buffer 83 formed inside the chamber side portion 63. The transport opening 66 has an outlet passage 86 formed to exhaust a gas within the heat treatment space 65 and connected through a valve 87 to an exhaust mechanism not shown.

FIG. 2 is a sectional view of the chamber 6 taken along a horizontal plane at the level of the gas inlet buffer 83. As illustrated in FIG. 2, the gas inlet buffer 83 is formed to extend over about one third of the inner periphery of the chamber side portion 63 on the opposite side from the transport opening 66 in FIG. 1, so that the processing gas introduced into the gas inlet buffer 83 through the inlet passage 81 is supplied through a plurality of gas supply holes 84 into the heat treatment space 65.

The heat treatment apparatus 1 further includes the generally disk-shaped holder 7 for holding a semiconductor wafer W in a horizontal position inside the chamber 6 and preheating the held semiconductor wafer W prior to photo-irradiation; and a holder elevating mechanism 4 for moving the holder 7 vertically relative to the chamber bottom portion 62, which is the bottom of the chamber 6. The holder elevating mechanism 4 in FIG. 1 includes a generally cylindrical shaft 41, a movable plate 42, guide members 43 (in the present preferred embodiment, three guide members 43 are located around the shaft 41), a fixed plate 44, a ball screw 45, a nut 46, and a motor 40. The chamber bottom portion 62, which is the bottom of the chamber 6, has a generally circular lower opening 64 that has a smaller diameter than the holder 7. The shaft 41 of stainless steel extends through the lower opening 64 and is connected to the underside of the holder 7 (in this preferred embodiment, a hot plate 71 of the holder 7) to support the holder 7.

The nut 46 in threaded engagement with the ball screw 45 is fixed to the movable plate 42. The movable plate 42 is movable in a vertical direction by being slidably guided by the guide members 43 that are fixed to and extend downwardly from the chamber bottom portion 62. The movable plate 42 is coupled to the holder 7 through the shaft 41.

The motor 40 is installed on the fixed plate 44 mounted to the lower ends of the guide members 43 and is connected to the ball screw 45 via a timing belt 401. When the holder elevating mechanism 4 moves the holder 7 vertically, the motor 40 serving as a driver rotates the ball screw 45 under the control of the controller 3 so that the movable plate 42 fixed to the nut 46 is moved along the guide members 43 in a vertical direction. The result is that the shaft 41 fixed to the movable plate 42 is moved in a vertical direction so that the holder 7 connected to the shaft 41 is moved up and down smoothly between a transfer position for transfer of a semiconductor wafer W in FIG. 1 and a processing position for processing of the semiconductor wafer W in FIG. 5.

On the upper surface of the movable plate 42, a mechanical stopper 451 of a generally semi-cylindrical shape (the shape formed by cutting a cylinder into half along its length) extends upright along the ball screw 45. Even if any anomalies happen to cause the movable plate 42 to move up above a given upper limit, the top end of the mechanical stopper 451 will strike an end plate 452 provided at the end of the ball screw 45, preventing irregular upward movement of the movable plate 42. This prevents the holder 7 from being moved up above a given level under the chamber window 61, thus avoiding collision of the holder 7 with the chamber window 61.

The holder elevating mechanism 4 further includes a manual elevator 49 for manually moving the holder 7 up and down for maintenance of the interior of the chamber 6. The manual elevator 49 includes a handle 491 and a rotary shaft 492 and can move the holder 7 up and down by rotating the rotary shaft 492 with the handle 491 to thereby rotate the ball screw 45 connected to the rotary shaft 492 via a timing belt 495.

On the underside of the chamber bottom portion 62, expandable and contractible bellows 47 that extend downwardly around the shaft 41 are provided, with their upper ends connected to the underside of the chamber bottom portion 62. The lower ends of the bellows 47 are mounted to a bellows-lower-end plate 471. The bellows-lower-end plate 471 is screwed to the shaft 41 with a collar member 411. The bellows 47 will contract when the holder elevating mechanism 4 moves the holder 7 upwardly relative to the chamber bottom portion 62, while they will expand when the holder elevating mechanism 4 moves the holder 7 downwardly. The expansion and contraction of the bellows 47 allows the heat treatment space 65 to be kept air-tight even during the upward and downward movement of the holder 7.

FIG. 3 is a sectional view of the structure of the holder 7. The holder 7 includes the hot plate (heating plate) 71 for preheating (what is called assisted heating) a semiconductor wafer W; and a susceptor 72 installed on the upper surface (the face where the holder 7 holds a semiconductor wafer W) of the hot plate 71. The underside of the holder 7 is, as described previously, connected to the shaft 41 for moving the holder 7 up and down. The susceptor 72 is made of quartz (or it may be of aluminum nitride (AlN) and the like) and has, on the upper surface, pins 75 for preventing misalignment of a semiconductor wafer W. The susceptor 72 is provided on the hot plate 71, with its underside in face-to-face contact with the upper surface of the hot plate 71. The susceptor 72 is thus capable of diffusing and transmitting heat energy from the hot plate 71 to a semiconductor wafer W placed on its upper surface and is cleanable during maintenance by being removed from the hot plate 71.

The hot plate 71 includes an upper plate 73 and a lower plate 74, both made of stainless steel. Resistance heating wires 76, such as nichrome wires, for heating the hot plate 71 are installed between the upper and lower plates 73 and 74, and a space between the upper and lower plates 73 and 74 is filled and sealed with electrically conductive brazing nickel (Ni). The upper and lower plates 73 and 74 are brazed to each other at their ends.

Figure 4:
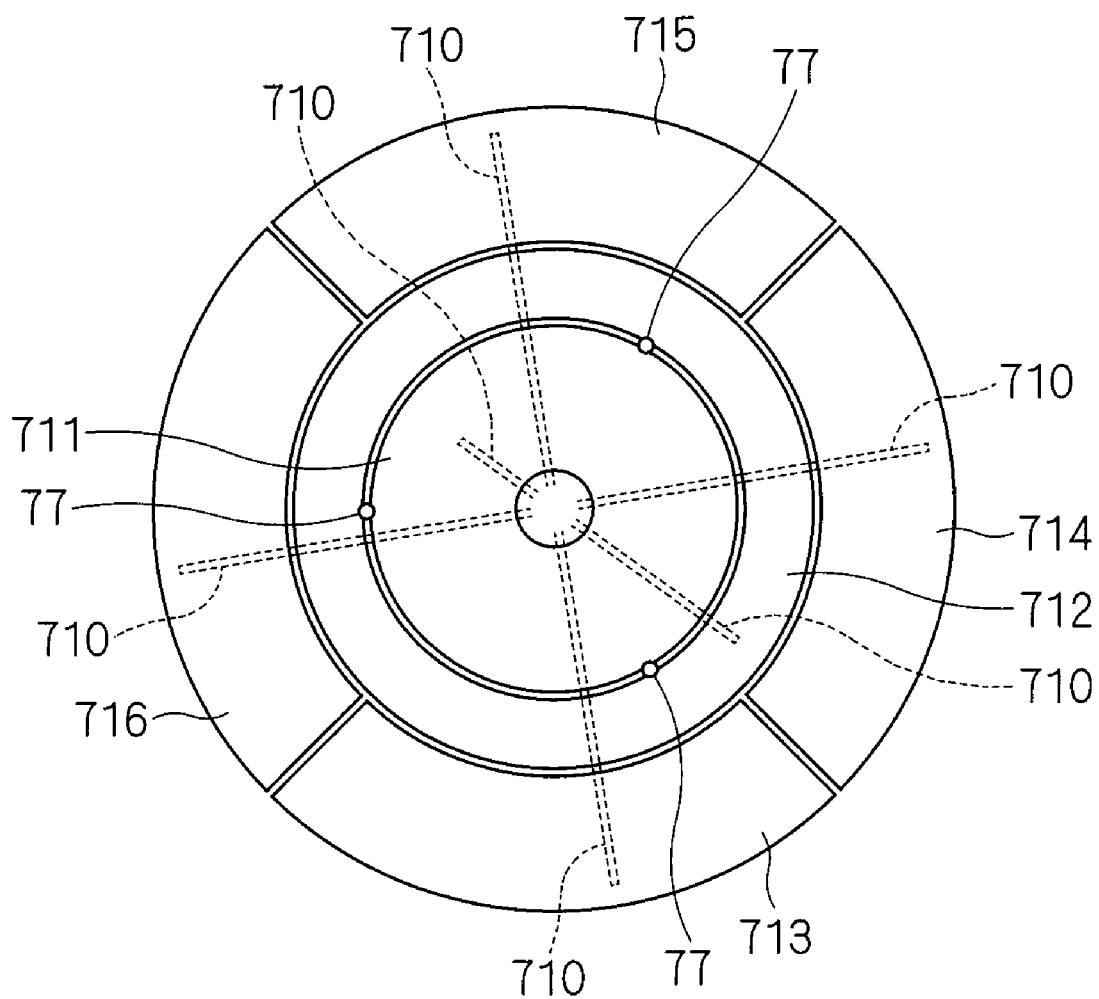
FIG. 4 is a plan view of a hot plate.

FIG. 4 is a plan view of the hot plate 71. As illustrated in FIG. 4, the hot plate 71 has a disk-shaped zone 711 and a ring-shaped zone 712 that are concentrically arranged in the central portion of an area facing a semiconductor wafer W being held; and four zones 713 to 716 formed by dividing a generally ring-shaped area around the zone 712 into four equal sections in a circumferential direction. Each pair of adjacent zones has a slight gap formed therebetween. The hot plate 71 is further provided with three through holes 77 through which the support pins 70 are inserted and which are spaced 120° apart from one another on the circumference of a gap between the zones 711 and 712.

In each of the six zones 711 to 716, the resistance heating wires 76 are installed independent of one another to circulate around each zone to form an individual heater, so that each zone is heated individually by its own built-in heater. A semiconductor wafer W held by the holder 7 is heated by those built-in heaters in the six zones 711 to 716. Each of the zones 711 to 716 has a sensor 710 for measuring the temperature of each zone with a thermocouple. Each sensor 710 is connected to the controller 3 through the inside of the generally cylindrical shaft 41.

In heating the hot plate 71, the controller 3 controls the amount of power supplied to the resistance heating wires 76 installed in each zone so that the temperature of each of the six zones 711 to 716 measured by the sensor 710 becomes a given preset temperature. The controller 3 uses PID (proportional integral derivative) control for the temperature control of each zone. In the hot plate 71, the temperature of each of the zones 711 to 716 is continuously measured until the heat treatment of a semiconductor wafer W is completed (or, when there are a plurality of semiconductor wafers W to be processed in succession, until the heat treatment of all the semiconductor wafers W is completed), and the amount of power supplied to the resistance heating wires 76 installed in each zone is controlled on an individual basis, i.e., the temperature of the heater built in each zone is controlled individually, so that the temperature of each zone is kept at a set temperature. The set temperature of each zone can be changed by only an individually determined offset value from a reference temperature.

The resistance heating wires 76 installed in each of the six zones 711 to 716 are connected to a power supply source (not shown) over a power line passing through the inside of the shaft 41. On the way from the power supply source to each zone, the power line from the power supply source is installed within a stainless tube filled with an insulator such as magnesia (magnesium oxide) so as to be electrically insulated from the other lines. The inside of the shaft 41 is open to the atmosphere.

The lamp house 5 includes, inside a casing 51, a light source including a plurality of (in this preferred embodiment, 30) xenon flash lamps FL, and a reflector 52 provided to cover over the light source. The lamp house 5 also has a lamp-light radiating window 53 mounted to the bottom of the casing 51. The lamp-light radiating window 53 forming the floor portion of the lamp house 5 is a plate-like member made of quartz. The lamp house 5 is provided above the chamber 6 so that the lamp-light radiating window 53 is opposed to the chamber window 61. The lamp house 5 applies light from the flash lamps FL through the lamp-light radiating window 53 and the chamber window 61 to a semiconductor wafer W held by the holder 7 within the chamber 6, to thereby heat the semiconductor wafer W.

The plurality of flash lamps FL, each of which is a rod-shaped lamp having an elongated cylindrical shape, are arranged in a plane so that they are longitudinally parallel to one another along the major surface (i.e., in the horizontal direction) of a semiconductor wafer W held by the holder 7. The plane defined by the arrangement of the flash lamps FL is accordingly a horizontal plane.

Figure 6:
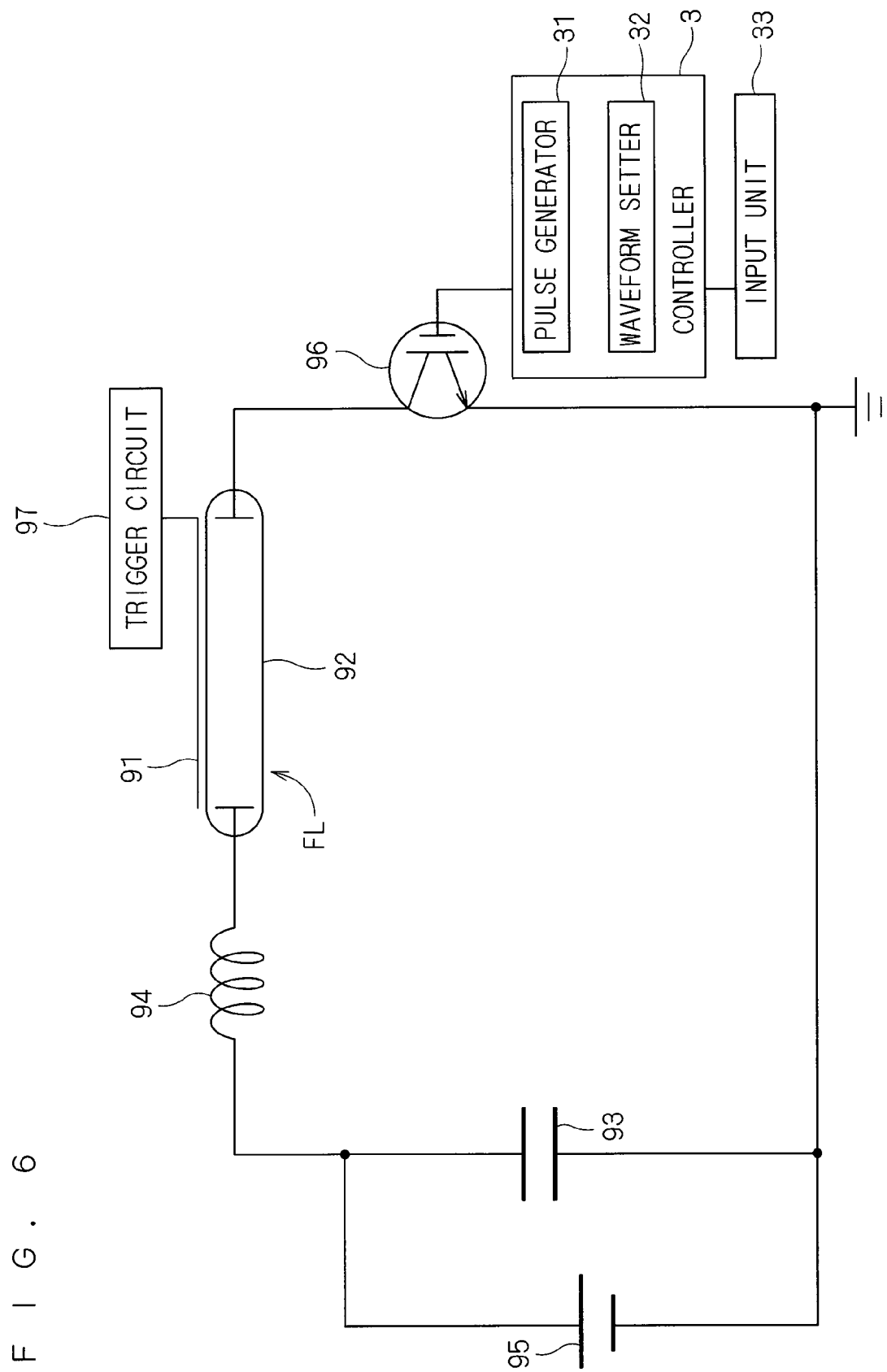
FIG. 6 shows a driving circuit for a flash lamp.

FIG. 6 illustrates a driving circuit for a flash lamp FL. As illustrated, a capacitor 93, a coil 94, a flash lamp FL, and a switching element 96 are connected in series. The flash lamp FL includes a rod-shaped glass tube (discharge tube) 92 containing a xenon gas sealed therein and having positive and negative electrodes provided on its opposite ends; and a trigger electrode 91 wound on the outer peripheral surface of the glass tube 92. Upon the application of a given voltage from a power supply unit 95, the capacitor 93 is charged in response to the applied voltage. A trigger circuit 97 is capable of applying voltage to the trigger electrode 91. The timing of the voltage application from the trigger circuit 97 to the trigger electrode 91 is under the control of the controller 3.

The present preferred embodiment employs an insulated gate bipolar transistor (IGBT) as the switching element 96. The IGBT is a bipolar transistor that incorporates a MOSFET (metal-oxide-semiconductor field-effect transistor) into the gate and is also a switching element suitable for handling a large amount of power. The switching element 96 receives, at its gate, a pulse signal from a pulse generator 31 in the controller 3.

Even if, with the capacitor 93 in the charged state, a pulse is output to the gate of the switching element 96 and a high voltage is applied to the electrodes across the glass tube 92, no electricity will flow through the glass tube 92 in a normal state because the xenon gas is electrically insulative. However, if the trigger circuit 97 applies voltage to the trigger electrode 91 to produce an electrical breakdown, current will flow instantaneously between the electrodes across the glass tube 92, and the resultant excitation of xenon atoms or molecules will induce light emission.

The reflector 52 in FIG. 1 is provided above the plurality of flash lamps FL to cover over all those flash lamps FL. A fundamental function of the reflector 52 is to reflect the light emitted from the plurality of flash lamps FL toward the holder 7. The reflector 52 is an aluminum alloy plate, and its surface (facing the flash lamps FL) is roughened by abrasive blasting to produce a satin finish thereon. Such surface roughing is required, because if the reflector 52 has a perfect mirror surface, the intensity of the reflected light from the plurality of flash lamps FL will exhibit a regular pattern, which can cause deterioration in the uniformity of the surface temperature distribution in the semiconductor wafer W.

The controller 3 controls the aforementioned various operating mechanisms provided in the heat treatment apparatus 1. The hardware configuration of the controller 3 is similar to that of a general computer. Specifically, the controller 3 includes a CPU for performing various computations; a ROM or read-only memory for storing basic programs therein; a RAM or readable/writable memory for storing various pieces of information therein; and a magnetic disk for storing control software, data, etc. therein. The controller 3 further includes the pulse generator 31 and a waveform setter 32 and is connected to an input unit 33. The input unit 33 may be any of various known input equipment such as a keyboard, a mouse, or a touch panel. The waveform setter 32 sets the waveform of a pulse signal based on the input contents from the input unit 33, and the pulse generator 31 generates a pulse signal in accordance with that waveform. The pulse generator 31 outputs the generated pulse signal to the gate of the switching element 96. This allows the controller 3 to control the energization of the flash lamp FL by turning the switching element 96 on or off, thereby controlling the emission output of the flash lamp FL.

The heat treatment apparatus 1 further includes, in addition to the above components, various cooling structures to prevent an excessive temperature rise in the chamber 6 and in the lamp house 5 due to heat energy generated by the flash lamps FL and the hot plate 71 during the heat treatment of a semiconductor wafer W. For instance, a water cooling tube (not shown) is provided in the chamber side portion 63 and the chamber bottom portion 62 of the chamber 6. The lamp house 5 forms an air cooling structure in which a gas supply pipe 55 and an exhaust pipe 56 are provided to form a gas flow therein and to exhaust heat (cf. FIGS. 1 and 5). Air is also supplied to a gap between the chamber window 61 and the lamp-light radiating window 53 to cool the lamp house 5 and the chamber window 61.

Next, a procedure for processing a semiconductor wafer W in the heat treatment apparatus 1 is described. A semiconductor wafer W to be processed herein is a semiconductor substrate doped with impurities (ions) by ion implantation. The activation of doped impurities and the repair of defects introduced during ion implantation are implemented by photo-irradiation heating (annealing) by the heat treatment apparatus 1.

Figure 5:
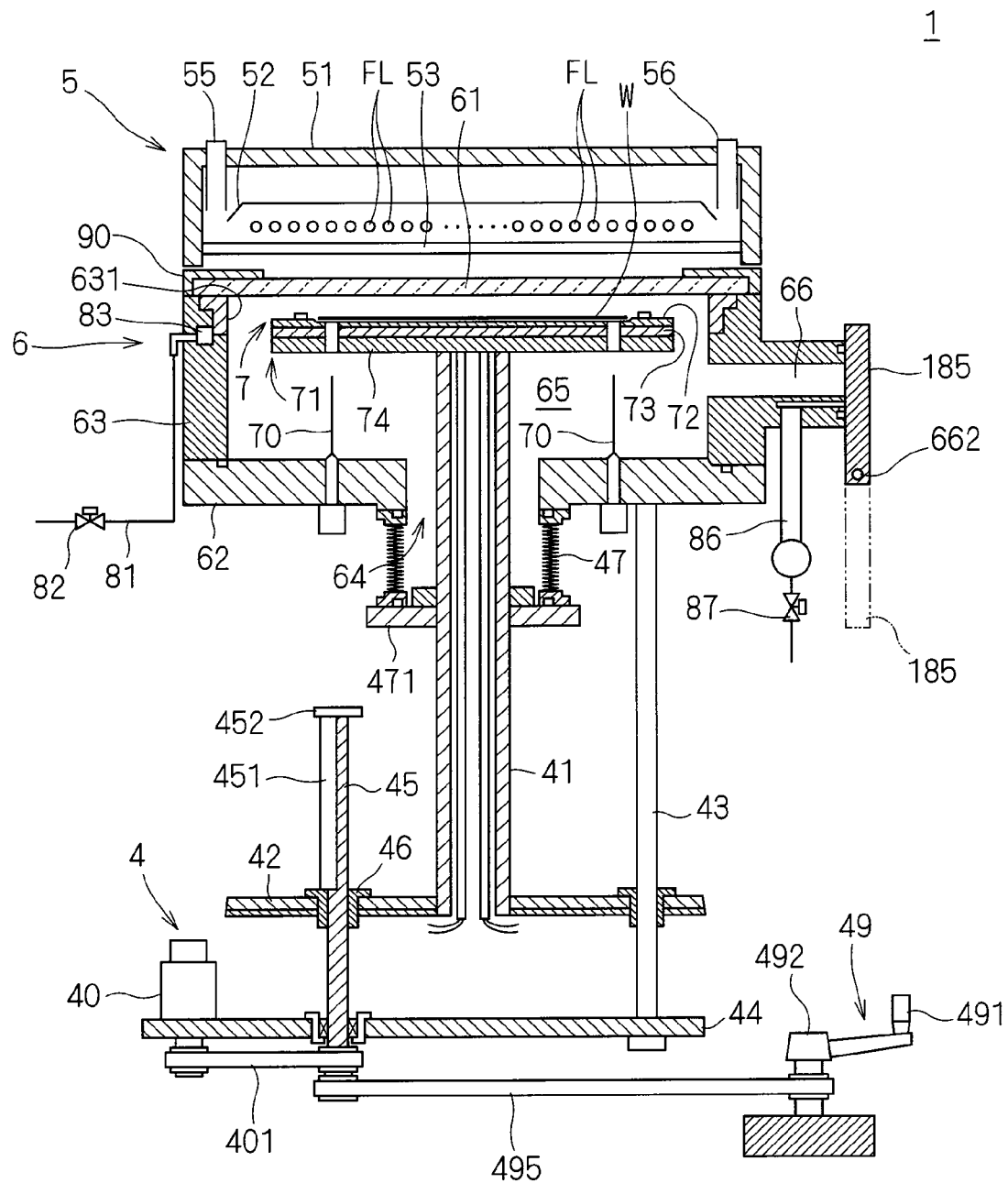
FIG. 5 is a side sectional view of the configuration of the heat treatment apparatus in FIG. 1.

First, the holder 7 is moved down from the processing position in FIG. 5 to the transfer position in FIG. 1. The "processing position" as used herein refers to the position of the holder 7 where light is applied from the flash lamps FL to the semiconductor wafer W, i.e., the position of the holder 7 within the chamber 6 shown in FIG. 5. The "transfer position" as used herein refers to the position of the holder 7 where the semiconductor wafer W is transported into and out of the chamber 6, i.e., the position of the holder 7 within the chamber 6 shown in FIG. 1. A reference position of the holder 7 in the heat treatment apparatus 1 is the processing position. Prior to processing, the holder 7 is in the processing position and, upon the start of processing, the holder 7 is moved down to the transfer position. When moved down to the transfer position as illustrated in FIG. 1, the holder 7 is brought into close proximity to the chamber bottom portion 62, so that the upper ends of the support pins 70 protrude through the holder 7 above the holder 7.

When the holder 7 is moved down to the transfer position, the valves 82 and 87 are opened to introduce a room-temperature nitrogen gas into the heat treatment space 65 of the chamber 6. Then, the gate valve 185 is opened to open the transport opening 66, whereby a semiconductor wafer W is transported through the transport opening 66 into the chamber 6 and placed on the plurality of support pins 70 by a transport robot outside the apparatus.

The nitrogen gas supplied into the chamber 6 during the transport of the semiconductor wafer W is purged from the chamber 6 at a rate of about 40 L/min. The supplied nitrogen gas will flow from the gas inlet buffer 83 in the direction of the arrows AR4 in FIG. 2 within the chamber 6 and will be exhausted through the outlet passage 86 and the valve 87 in FIG. 1, using a utility exhaust system. Part of the nitrogen gas supplied into the chamber 6 is also exhausted from an exhaust port (not shown) provided inside the bellows 47. In each step described below, the nitrogen gas is continuously supplied into and exhausted from the chamber 6, and the amount of nitrogen gas supply may vary widely in accordance with each step for processing the semiconductor wafer W.

After the transport of the semiconductor wafer W into the chamber 6, the transport opening 66 is closed with the gate valve 185. Then, the holder elevating mechanism 4 moves the holder 7 upwardly from the transfer position to the processing position, which is in close proximity to the chamber window 61. In the course of the upward movement of the holder 7 from the transfer position, the semiconductor wafer W is transferred from the support pins 70 to the susceptor 72 of the holder 7 and then placed and held on the upper surface of the susceptor 72. When the holder 7 is moved up to the processing position, the semiconductor wafer W held on the susceptor 72 is also held at the processing position.

Each of the six zones 711 to 716 of the hot plate 71 has been heated up to a given temperature by its own individually built-in heater (the resistance heating wires 76) in each zone (between the upper plate 73 and the lower plate 74). By the holder 7 being moved up to the processing position and brought into contact with the semiconductor wafer W, the semiconductor wafer W is preheated by the heaters built in the hot plate 71 and its temperature rises gradually.

FIG. 7 shows the change in the surface temperature of a semiconductor wafer W from the start of preheating. Preheating for time t1 at the processing position causes the temperature of a semiconductor wafer W to rise up to a preset preheating temperature T1. The preheating temperature T1 is of the order of 200 to 800° C., preferably of the order of 350 to 600° C. (in the present preferred embodiment, 600° C.,) at which temperature there is no apprehension that impurities used in doping the semiconductor wafer W are heat diffused. The time t1 for preheating the semiconductor wafer W ranges from about 3 to about 200 seconds (in the present preferred embodiment, 60 seconds.) The distance between the holder 7 and the chamber window 61 may be varied arbitrarily by controlling the amount of rotation of the motor 40 in the holder elevating mechanism 4.

After the lapse of a preheating time t1, photo-irradiation heating of the semiconductor wafer W is started using the flash lamps FL at time A. For photo-irradiation from the flash lamps FL, the capacitor 93 should be charged in advance by the power supply unit 95. Then, with the capacitor 93 in the charged state, a pulse signal is output from the pulse generator 31 in the controller 3 to the switching element 96.

Figure 8:
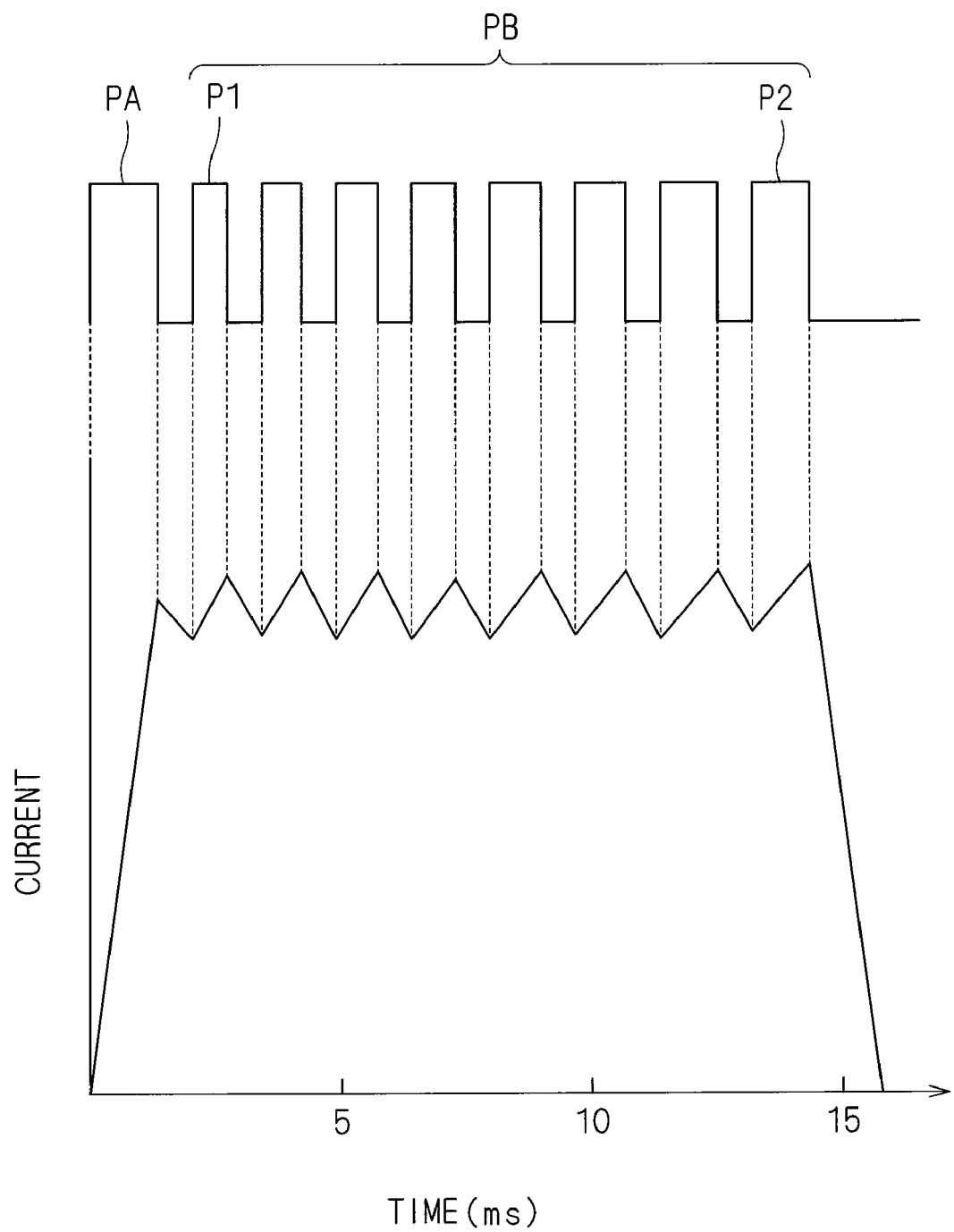
FIG. 8 shows an example of the correlation between the waveform of a pulse signal and the current flowing through a circuit.

FIG. 8 shows an example of the correlation between the waveform of a pulse signal and the current flowing through a circuit. In the present example, a pulse signal having a waveform as illustrated in the upper part of FIG. 8 is output from the pulse generator 31. The pulse signal waveform can be defined by inputting from the input unit 33 a set of instructions that sequentially define a period of time (ON time) during which the pulse is at a high level and a period of idle time (OFF time) between pulses. When an operator inputs such a set of instructions from the input unit 33 to the controller 3, the waveform setter 32 in the controller 3 sets a pulse waveform as illustrated in the upper part of FIG. 8. The pulse waveform illustrated in the upper part of FIG. 8 is set to include an initial relatively long pulse PA and a subsequent plurality of relatively short pulses PB. The plurality of relatively short pulses PB are so set that their pulse widths increase (i.e., their periods of time extend) gradually from the first pulse P1 toward the last pulse P2. Then, the pulse generator 31 outputs a pulse signal in accordance with the pulse waveform set by the waveform setter 32. As a result, a pulse signal having a waveform as illustrated in the upper part of FIG. 8 is applied to the gate of the switching element 96, for control of the on/off driving of the switching element 96.

In synchronization with the timing of the turning on of the pulse signal output from the pulse generator 31, the controller 3 causes the trigger circuit 97 to apply a voltage to the trigger electrode 91. Thereby, when the pulse signal input to the gate of the switching element 96 is ON, current flows inevitably between the electrodes across the glass tube 92, and the resultant excitation of xenon atoms or molecules induces light emission. Outputting the pulse signal having a waveform as illustrated in the upper part of FIG. 8 from the controller 3 to the gate of the switching element 96 and applying a voltage to the trigger electrode 91 in synchronization with the timing of the turning on of the pulse signal produce a current flow as illustrated in the lower part of FIG. 8 through the circuit including the flash lamp FL. In other words, when a pulse signal input to the gate of the switching element 96 is ON, the value of the current flowing through the glass tube 92 in the flash lamp FL will increase. It is noted herein that an individual current waveform corresponding to each pulse is defined by the constant of the coil 94.

The flow of a current having a waveform as illustrated in the lower part of FIG. 8 induces light emission from the flash lamp FL. The emission output of the flash lamp FL is almost proportional to the current flowing through the flash lamp FL. Thus, the output waveform of the emission output of the flash lamp FL exhibits a pattern as illustrated in the upper part of FIG. 9. In accordance with the output waveform from the flash lamp FL as illustrated in the upper part of FIG. 9, photo-irradiation of the semiconductor wafer W held at the processing position by the holder 7 is performed. As a result, the surface temperature of the semiconductor wafer W changes as illustrated in the lower part of FIG. 9.

If, as in conventional cases, each flash lamp FL emits light without the use of the switching element 96, the charge stored in the capacitor 93 is consumed by only one instance of light emission, so that the flash lamp FL will produce a single-pulse output waveform having a width of the order of 0.1 to 10 milliseconds. On the other hand, if, as in the present preferred embodiment, the switching element 96 is connected in the circuit and a pulse signal as illustrated in the upper part of FIG. 8 is output to the gate of the switching element 96, the light emission from the flash lamp FL is, in a sense, chopper-controlled. Thus, the charge stored in the capacitor 93 can be divided for consumption, and the flash lamp FL will repeatedly flash within an extremely short period of time. As illustrated in FIG. 8, it is noted herein that the emission output will never become exactly zero even during the repeated flashing of the flash lamp FL because before the value of the current becomes exactly zero, the next pulse is applied to the gate of the switching element 96 to increase the value of the current again.

The output waveform as illustrated in the upper part of FIG. 9, as compared with the conventional single-pulse waveform, can be regarded as relatively extending the emission time while maintaining the emission output as almost constant. In other words, after initial photo-irradiation of a semiconductor wafer W is performed while increasing the emission output of the flash lamp FL to a target value LP (first photo-irradiation step), succeeding photo-irradiation of the semiconductor wafer W is performed while maintaining the emission output within a range of plus or minus 20% from the target value LP (second photo-irradiation step.)

To be more specific, in the initial photo-irradiation, the pulse generator 31, as a first step, outputs a relatively long pulse PA to the gate of a switching element 96, whereby the switching element 96 is turned on to increase the emission output of the flash lamp FL to the target value LP. As illustrated in the lower part of FIG. 8, the value of the current flowing through the flash lamp FL increases during the ON state of the switching element 96, and in proportion to this, the emission output from the flash lamp FL also increases.

After the emission output from the flash lamp FL has increased to the target value LP, the process transitions to the succeeding photo-irradiation. In the succeeding photo-irradiation, the pulse generator 31 intermittently outputs a plurality of relatively short pulses PB to the gate of the switching element 96, thereby repeating the turning on and off of the switching element 96 so as to achieve a stable state where the emission output from the flash lamp FL is maintained within the range of plus or minus 20% from the target value LP. As illustrated in the lower part of FIG. 8, the value of the current flowing through the flash lamp FL drops during the OFF state of the switching element 96; it will be increased again by turning the switching element 96 on before it drops down considerably. Then, before the value of the current rises considerably, the switching element 96 is turned off again, so that the value of the current drops again. By repeating this turning on and off, the value of the current flowing through the flash lamp FL can be maintained at approximately a constant value, as a result of which the emission output from the flash lamp FL can be maintained with stability within the range of plus or minus 20% from the target value LP.

During this succeeding photo-irradiation, a current of 100 to 1500 A will flow through the flash lamp FL through the application of a voltage of 5000 to 500 V. Under this maintained light-emission condition, the irradiation energy of light emitted to the surface of the semiconductor wafer W held at the processing position by the holder 7 ranges from 5 to 100 J/cm$^2$ during the succeeding photo-irradiation. In the actual succeeding photo-irradiation, the emission output from the flash lamp FL may increase instantaneously due to an instantaneous flow of a large current (inrush current) at the instant when the switching element 96 is turned on. When such inrush current is taken into consideration, the range of fluctuation in the emission output is plus or minus 20%. FIGS. 8 and 9 show such an inrush current being smoothed. In the case of smoothing such an inrush current, the emission output from the flash lamp FL can be regarded as being maintained with stability within a range of plus or minus 10% from the target value LP.

Moreover, in the succeeding photo-irradiation, the pulse widths increase gradually from the first pulse P1 of the plurality of pulses PB toward the last pulse P2.

In other words, the controller 3 repeats the turning on and off of the switching element 96 in such a manner that, during the stable state, the ON-state periods extend gradually from the first ON-state period toward the last ON-state period. This is because if the plurality of pulses PB have a constant pulse width during the succeeding photo-irradiation, the value of the current flowing through the flash lamp FL may drop gradually, thereby possibly causing the emission output from the flash lamp FL to decrease to below 20% from the target value LP. Extending the pulse widths gradually from the first pulse P1 toward the last pulse P2 allows the value of the current flowing through the flash lamp FL to be maintained at almost a constant value, so that the emission output from the flash lamp FL can be maintained with stability within the range of plus or minus 20% from the target value LP. It is noted herein that the period of time during which the switching element 96 is off is unchanged during the succeeding photo-irradiation.

The photo-irradiation time for the initial photo-irradiation ranges from 0.1 to 10 milliseconds, and the photo-irradiation time for the succeeding photo-irradiation ranges from 5 milliseconds to less than one second. However, a total time of photo-irradiation from the flash lamps FL during one instance of flash heating, i.e., the total of the photo-irradiation time for the initial photo-irradiation and the photo-irradiation time for the succeeding photo-irradiation, should be one second or less.

The aforementioned initial photo-irradiation and succeeding photo-irradiation from the flash lamps FL in accordance with the output waveform as illustrated in the upper part of FIG. 9 cause the surface temperature of the semiconductor wafer W to rise from the preheating temperature T1 up to a processing temperature T2. The processing temperature T2 is of the order of 1000 to 1300° C. (in the present preferred embodiment, about 1000° C.); at which temperature, impurities implanted in the semiconductor wafer W are activated. In the present preferred embodiment, during the course of the transition from the initial photo-irradiation to the succeeding photo-irradiation, the surface temperature of the semiconductor wafer W rises up to the processing temperature T2 more slowly than in the case of a conventional single pulse as illustrated in the lower part of FIG. 9. Then, during the succeeding photo-irradiation, the emission output from the flash lamp FL is maintained within the range of plus or minus 20% from the target value LP, whereby the surface temperature of the semiconductor wafer W is maintained at the processing temperature T2 for over 10 milliseconds. By implementing such heating, the temperature even at a somewhat greater depth below the ion-impregnated layer, to which depth defects are introduced, can be raised to some extent, as a result of which even the repair of defects can proceed. In addition, since, as illustrated in the lower part of FIG. 9, the surface temperature of the semiconductor wafer W will never considerably rise above the processing temperature T2, the semiconductor wafer W can be prevented from being damaged thermally.

After completion of the succeeding photo-irradiation, the surface temperature of the semiconductor wafer W drops rapidly from the processing temperature T2. Then, after completion of the photo-irradiation heating with the flash lamps FL and after approximately a 10-second standby at the processing position, the holder elevating mechanism 4 moves the holder 7 again down to the transfer position in FIG. 1, at which position the semiconductor wafer W is transferred from the holder 7 to the support pins 70. Subsequently, the transport opening 66, which had been closed by the gate valve 185, is opened, so that the semiconductor wafer W placed on the support pins 70 is transported out by the transport robot outside the apparatus. This completes the photo-irradiation heating of the semiconductor wafer W in the heat treatment apparatus 1.

As described previously, during the heat treatment of the semiconductor wafer W in the heat treatment apparatus 1, a nitrogen gas is continuously supplied into the chamber 6. The amount of that supply is approximately 30 liters per minute when the holder 7 is at the processing position, and approximately 40 liters per minute when the holder 7 is at any position other than the processing position.

As discussed earlier, in the conventional single-pulse flash photo-irradiation, the implementation of high-energy irradiation or long-pulse flash photo-irradiation in order to enable even the repair of defects causes a significant rise in the surface temperature, thereby causing thermal damage to a semiconductor wafer W. In the present preferred embodiment, after the initial photo-irradiation of a semiconductor wafer W is performed while increasing the emission output to the target value LP, the succeeding photo-irradiation of the semiconductor wafer W is performed while maintaining the emission output within the range of plus or minus 20% from the target value LP. The implementation of such photo-irradiation heating can prevent the surface temperature of the semiconductor wafer W from rising considerably above the processing temperature T2 as well as allowing the temperature even at a somewhat greater depth below the surface to be raised to some extent. Consequently, both the activation of implanted ions and the repair of introduced defects can be achieved without any thermal damage to the semiconductor wafer W.

The reason why the emission output from the flash lamp FL during the succeeding photo-irradiation is maintained within the range of plus or minus 20% from the target value LP is because, if the emission output increases to above 20% from the target value LP, the surface temperature of the semiconductor wafer W will rise above the processing temperature T2, which will cause thermal damage. Likewise, if the emission output decreases to below 20% from the target value LP, the surface temperature of the semiconductor wafer W will drop considerably below the processing temperature T2, in which case although ion activation is still possible, the repair of introduced defects is difficult.

In the photo-irradiation heating according to the present preferred embodiment, the total time of photo-irradiation from the flash lamps FL is one second or less; the photo-irradiation time for the initial photo-irradiation during the ON state of the switching element 96 ranges from 0.1 to 10 milliseconds; and the photo-irradiation time for the succeeding photo-irradiation during which the turning on and off of the switching element 96 is repeated ranges from 5 milliseconds to less than one second. The reason why the photo-irradiation time for the initial photo-irradiation is 10 milliseconds or less is because, if the first ON-state period of the switching element 96 exceeds 10 milliseconds, the emission output from the flash lamp FL will increase considerably above the target value LP and cause the surface temperature of the semiconductor wafer W to rise above the processing temperature T2, thereby causing thermal damage. The reason why the photo-irradiation time for the succeeding photo-irradiation is 5 milliseconds or more is in order to maintain the surface temperature of the semiconductor wafer W at the processing temperature T2 for such a period of time that the repair of defects can proceed.

Figure 10:
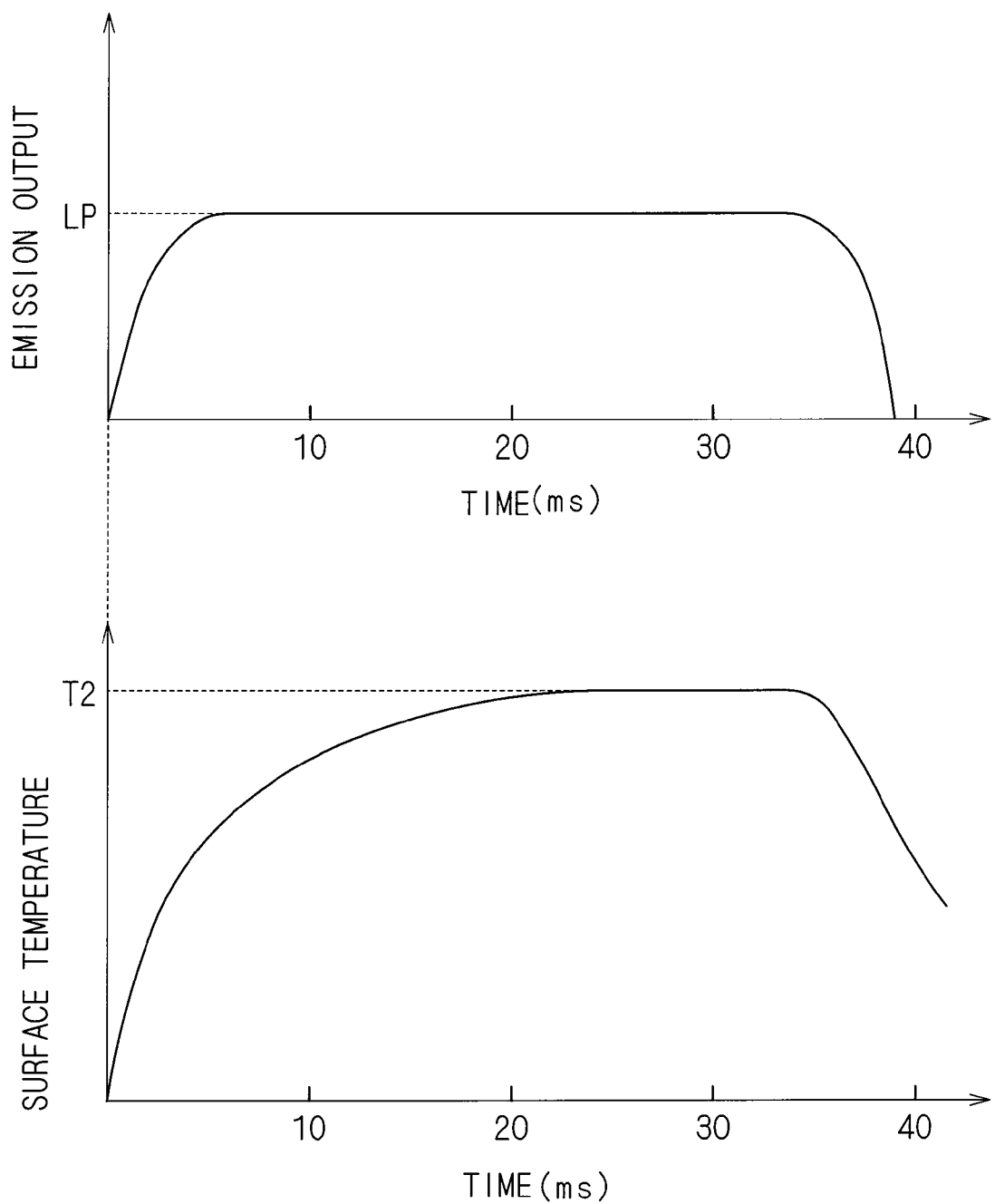
FIG. 10 shows another example of the correlation between the emission output of a flash lamp and the surface temperature of a semiconductor wafer.

While the preferred embodiment according to the invention has been described so far, various modifications of the invention in addition to those described above may be made without departing from the scope and spirit of the invention. For instance, the photo-irradiation heating using the flash lamps FL is not limited to the one in the example of FIG. 9; it may, for example, be the one as illustrated in FIG. 10. Also in the example illustrated in the upper part of FIG. 10, after the initial photo-irradiation of a semiconductor wafer W is performed while increasing the emission output from the flash lamps FL to the target value LP, the succeeding photo-irradiation of the semiconductor wafer W is performed while maintaining the emission output within the range of plus or minus 20% from the target value LP. The example in the upper part of FIG. 10 differs from the one in the upper part of FIG. 9 in that the photo-irradiation time for the succeeding photo-irradiation is longer than that in the example of FIG. 9. By extending the photo-irradiation time for the succeeding photo-irradiation during which the turning on and off of the switching element 96 is repeated, the period of time during which the surface temperature of the semiconductor wafer W is maintained at the processing temperature T2 can be extended as illustrated in the lower part of FIG. 10.

Even in this case, the surface temperature of the semiconductor wafer W will never rise considerably above the processing temperature T2, and since the temperature even at a somewhat greater depth below the surface can be raised to some extent, both the activation of implanted ions and the repair of introduced defects can be implemented without any thermal damage to the semiconductor wafer W as in the above preferred embodiment. Although the photo-irradiation time for the succeeding photo-irradiation may still be longer than in the example of FIG. 10, a total of the photo-irradiation time for the initial photo-irradiation and the photo-irradiation time for the succeeding photo-irradiation should be one second or less.

In summary, photo-irradiation heating for a total photo-irradiation time of one second or less (what is called "millisecond annealing") should be implemented in such a manner that, after the initial photo-irradiation of a semiconductor wafer W is performed while increasing the emission output to the target value LP, the succeeding photo-irradiation of the semiconductor wafer W is performed while maintaining the emission output within the range of plus or minus 20% from the target value LP. If such photo-irradiation is possible, a different circuit configuration from the one illustrated in FIG. 6 may be employed. For instance, two power supply circuits having different coil constants may be connected to a single flash lamp FL. Moreover, the light source is not limited to the flash lamps FL as long as it is capable of enabling photo-irradiation for one second or less; it may, for example, be a laser. By implementing the aforementioned photo-irradiation heating, the temperature of the semiconductor wafer W even at a somewhat greater depth below the surface can be raised to some extent, with the surface temperature being maintained at the processing temperature T2. Thus, both the activation of implanted ions and the repair of introduced defects can be achieved without any thermal damage to the semiconductor wafer W.

While in the above preferred embodiment, the pulse widths during the succeeding photo-irradiation increase gradually from the first pulse P1 of the plurality of pulses PB toward the last pulse P2, if the first pulse P1 is longer than the last pulse P2, i.e., if the last ON-state period of a switching element 96 is longer than the first ON-state period during the stable state, the ON-state periods during the stable state may extend either steadily or in stages. This allows the value of the current flowing through the flash lamp FL to be maintained almost at a constant value, thus allowing the emission output from the flash lamp FL to be maintained within the range of plus or minus 20% from the target value LP.

Figure 11:
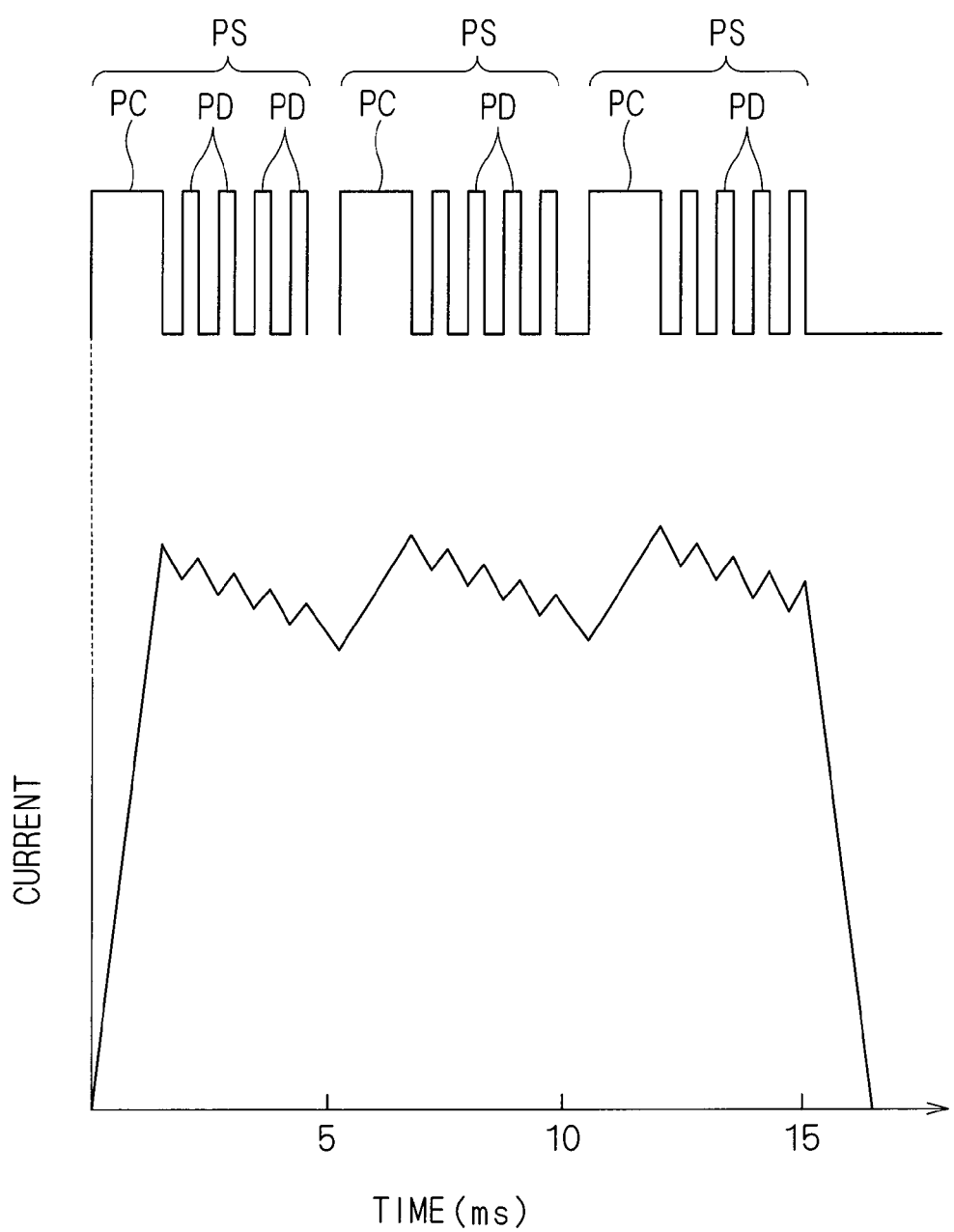
FIG. 11 shows another example of the correlation between the waveform of a pulse signal and the current flowing through a circuit.

Alternatively, the pulse generator 31 may output a pulse signal as illustrated in FIG. 11 to a switching element 96. FIG. 11 shows another example of the correlation between the waveform of a pulse signal and the current flowing through a circuit. The pulse waveform illustrated in the upper part of FIG. 11 is set to include a plurality of pulse sets PS each consisting of a relatively long pulse PC and a subsequent plurality of relatively short pulses PD. In other words, relatively long pulses PC are mixed at suitable intervals with the plurality of relatively short pulses PD. Such a pulse waveform is set by the waveform setter 32 and is output as a pulse signal from the pulse generator 31, as a result of which a pulse signal having a waveform as illustrated in the upper part of FIG. 11 is applied to the gate of a switching element 96 for control of the on/off driving of the switching element 96. This case is the same as described previously in that the controller 3 causes the trigger circuit 97 to apply voltage to the trigger electrode 91 in synchronization with the timing of the turning on of the pulse signal output from the pulse generator 31.

In this way, the current as illustrated in the lower part of FIG. 11 flows through a circuit which includes a flash lamp FL therein, inducing light emission from the flash lamp FL, and the resultant emission output exhibits, as in the above preferred embodiment, an output waveform having a pattern as illustrated in the upper part of FIG. 9. In other words, after the initial photo-irradiation of a semiconductor wafer W is performed while increasing the emission output from the flash lamp FL to the target value LP, then the succeeding photo-irradiation of the semiconductor wafer W is performed while maintaining the emission output within the range of plus or minus 20% from the target value LP. In the initial photo-irradiation, the pulse generator 31, as a first step, outputs a relatively long pulse PC (a pulse PC in the initial pulse set PS) to the gate of a switching element 96, whereby the switching element 96 is turned on so as to increase the emission output of the flash lamp FL to the target value LP. Then, after the emission output from the flash lamp FL has increased to the target value LP, the process transitions to the succeeding photo-irradiation. In the succeeding photo-irradiation, the pulse generator 31 outputs a combination of a relatively long pulse PC and a plurality of relatively short pulses PD repeatedly a plurality of times to the gate of the switching element 96, thereby repeating the turning on and off of the switching element 96 so as to achieve a stable state where the emission output from the flash lamp FL is maintained within a range of plus or minus 20% from the target value LP.

In the example of FIG. 11, the controller 3 repeats the turning on and off of a switching element 96 in such a way as to repeat a combination of a relatively long ON-state period and a subsequent plurality of relatively short ON-state periods a plurality of times, i.e., to achieve both the relatively short ON-state periods and the relatively long ON-state periods which are mixed at suitable intervals with the relatively short ON-state periods. Also in this case, as in the above preferred embodiment, by implementing photo-irradiation with a pattern as illustrated in the upper part of FIG. 9, the temperature of a semiconductor wafer W even at a somewhat greater depth below the surface can be raised to some extent with the surface temperature being maintained at the processing temperature T2. Thus, both the activation of implanted ions and the repair of introduced defects can be achieved without any thermal damage to the semiconductor wafer W.

As another alternative, the waveform of a pulse signal that is output from the pulse generator 31 to the gate of a switching element 96 during the stable state may be a combination of waveforms as illustrated in FIGS. 8 and 11. More specifically, when a combination of a relatively long ON-state period of a switching element 96 and a subsequent plurality of relatively short ON-state periods is repeated a plurality of times during the stable state, the ON-state periods are extended with time. At this time, only the relatively long ON-state period may be extended, or both the relatively long ON-state period and the relatively short ON-state periods may be extended.

The means of setting a pulse signal waveform is not limited to inputting parameters, such as a pulse width, one by one from the input unit 33. For instance, an operator may directly and graphically input a waveform with the input unit 33, or may read out a previously set waveform stored in a storage device such as a magnetic disk, or may download a waveform from outside the heat treatment apparatus 1.

While in the above preferred embodiment a voltage is applied to the trigger electrodes 91 in synchronization with the timing of the turning on of a pulse signal, the timing of the trigger-voltage application is not limited thereto: the voltage may be applied at any fixed intervals irrespective of the pulse signal waveform. Moreover, if a pulse signal has a narrow space width so that the value of a current caused by a certain pulse to flow through a flash lamp FL is to still remain at a given value or more when the flash lamp FL is energized by the next pulse, current will continue to flow as is through the flash lamp FL, in which case it is not necessary to apply the trigger voltage for each pulse. If, as illustrated in FIG. 8 in the above preferred embodiment, all the space widths of a pulse signal are narrow, the trigger voltage may be applied only when the initial pulse PA is output, and thereafter without the application of trigger voltage, only the pulse signal illustrated in the upper part of FIG. 8 should be output to the gate of the switching element 96 to produce the current waveform as illustrated in the lower part of FIG. 8. In other words, as long as current flows through a flash lamp FL when a pulse signal is turned on, the timing of the trigger-voltage application is arbitrary.

In the above preferred embodiment, the lamp house 5 includes 30 flash lamps FL; however, the invention is not limited thereto and the number of flash lamps FL is arbitrary.

Moreover, the flash lamps FL are not limited to xenon flash lamps; they may be krypton flash lamps.

In the above preferred embodiment, IGBTs are used as the switching elements 96; however, the invention is not limited thereto. For example, any transistor or device other than an IGBT may be employed as long as it is capable of turning a circuit on or off in accordance with the waveform of an input pulse signal. It is, however, preferable that an IGBT or a GTO (gate turn-off) thyristor that is suitable for handling a large amount of power should be used as a switching element 96 because light emission from a flash lamp FL consumes a considerably large amount of power.

A substrate to be processed by the heat treatment apparatus according to the present invention is not limited to a semiconductor wafer; it may, for example, be a glass substrate for use in a liquid crystal display. Moreover, the technique according to the present invention may be applied to the connection of metal and silicon, or the crystallization of polysilicon.

While the invention has been described in detail, the foregoing description is in all aspects illustrative and not restrictive. It is therefore understood that numerous modifications and variations can be devised without departing from the scope of the invention.

What is claimed is:

1. A heat treatment method for heating a substrate by photo-irradiation of the substrate, the method comprising:
   a first photo-irradiation step of performing photo-irradiation of a substrate while increasing an emission output to a target value; and
   a second photo-irradiation step of performing photo-irradiation of the substrate while maintaining the emission output within a range of plus or minus 20% from said target value; wherein
   a total of a photo-irradiation time in said first photo-irradiation step and a photo-irradiation time in said second photo-irradiation step is one second or less, and
   the photo-irradiation time in said second photo-irradiation step ranges from 5 milliseconds to less than one second.

2. The heat treatment method according to claim 1, wherein the photo-irradiation time in said first photo-irradiation step ranges from 0.1 to 10 milliseconds.

3. The heat treatment method according to claim 1, wherein an irradiation energy directed onto the substrate in said second photo-irradiation step ranges from 5 to 100 J/cm$^2$.

4. The heat treatment method according to claim 3, wherein a flash lamp is used for photo-irradiation in said first photo-irradiation step and in said second photo-irradiation step, and
   a value of a current flowing through said flash lamp in said second photo-irradiation step ranges from 100 to 1500 A.

5. A heat treatment apparatus for heating a substrate by photo-irradiation of the substrate, the apparatus comprising:
   a holder for holding a substrate;
   a photo-irradiation part for irradiating a substrate held by said holder with light; and
   a light-emission controller for controlling an emission output of said photo-irradiation part,
   said light-emission controller being configured to control the emission output of said photo-irradiation part in such a manner that, after an initial photo-irradiation of a substrate is performed while increasing the emission output to a target value, a succeeding photo-irradiation of the substrate is performed while maintaining the emission output within a range of plus or minus 20% from said target value,
   said light-emission controller being also configured to control said photo-irradiation part in such a manner that a total of a photo-irradiation time for said initial photo-irradiation and a photo-irradiation time for said succeeding photo-irradiation is one second or less and that the photo-irradiation time for said succeeding photo-irradiation ranges from 5 milliseconds to less than one second.

6. The heat treatment apparatus according to claim 5, wherein
   said light-emission controller is configured to control said photo-irradiation part in such a manner that the photo-irradiation time for said initial photo-irradiation ranges from 0.1 to 10 milliseconds.

7. The heat treatment apparatus according to claim 5, wherein
   said light-emission controller is configured to control said photo-irradiation part in such a manner that an irradiation energy directed onto the substrate during said succeeding photo-irradiation ranges from 5 to 100 J/cm$^2$.

8. The heat treatment apparatus according to claim 7, wherein
   said photo-irradiation part includes a flash lamp,
   said light-emission controller is so configured that a value of a current flowing through said flash lamp during said succeeding photo-irradiation ranges from 100 to 1500 A.

9. A heat treatment apparatus for heating a substrate by photo-irradiation of the substrate, the apparatus comprising:
   a holder for holding a substrate;
   a flash lamp for irradiating a substrate held by said holder with light; and
   a switching element connected in series to said flash lamp, a capacitor, and a coil; and
   an energization controller for controlling the energization of said flash lamp by turning said switching element on or off,
   said energization controller being configured first to turn said switching element on so as to increase an emission output from said flash lamp to a target value and then to repeat the turning on and off of said switching element so as to achieve a stable state where the emission output of said flash lamp is maintained within a range of plus or minus 20% from said target value.

10. The heat treatment apparatus according to claim 9, wherein
    said energization controller is configured to repeat the turning on and off of said switching element in such a manner that, during said stable state, a combination of an ON-state period of a given time and a subsequent plurality of ON-state periods, each of which is shorter than said given time, is repeated a plurality of times.

11. The heat treatment apparatus according to claim 9, wherein
    said energization controller is configured to repeat the turning on and off of said switching element in such a manner that, during said stable state, the last ON-state period is longer than the first ON-state period.

12. The heat treatment apparatus according to claim 11, wherein
    said energization controller is configured to repeat the turning on and off of said switching element in such a manner that, during said stable state, the ON-state periods are extended gradually from said first ON-state period to said last ON-state period.

13. The heat treatment apparatus according to claim 9, wherein
said switching element is a transistor, and
said energization controller includes a pulse-signal generator generating and outputting a pulse signal including at least one pulse to the gate of said transistor.

14. The heat treatment apparatus according to claim 13, wherein
said transistor is an insulated gate bipolar transistor.

* * * * *